United States Patent
Momiyama et al.

(10) Patent No.: US 11,557,467 B2
(45) Date of Patent: Jan. 17, 2023

(54) ELECTROSTATIC CHUCK

(71) Applicant: TOTO LTD., Kitakyushu (JP)

(72) Inventors: Yutaka Momiyama, Kitakyushu (JP);
Minoru Suzuki, Kitakyushu (JP);
Hitoshi Sasaki, Kitakyushu (JP);
Tsukasa Shigezumi, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 337 days.

(21) Appl. No.: 17/009,216

(22) Filed: Sep. 1, 2020

(65) Prior Publication Data
US 2021/0074525 A1    Mar. 11, 2021

(30) Foreign Application Priority Data

Sep. 5, 2019    (JP) .............................. JP2019-162313

(51) Int. Cl.
*H01L 21/683* (2006.01)
*H01T 23/00* (2006.01)
*H01J 37/32* (2006.01)

(52) U.S. Cl.
CPC .... *H01J 37/32715* (2013.01); *H01J 37/3255* (2013.01); *H01L 21/6833* (2013.01)

(58) Field of Classification Search
CPC .......... H01J 37/32532; H01J 37/32715; H01L 21/6833

USPC ......................................................... 361/234
See application file for complete search history.

(56) References Cited

U.S. PATENT DOCUMENTS

2009/0199967 A1    8/2009    Himori et al.
2011/0096461 A1    4/2011    Yoshikawa et al.

FOREIGN PATENT DOCUMENTS

JP    2009-188342 A    8/2009
JP    2011-119654 A    6/2011

*Primary Examiner* — Jared Fureman
*Assistant Examiner* — Lucy M Thomas
(74) *Attorney, Agent, or Firm* — Carrier Shende & Associates, P.c.; Joseph P. Carrier; Fulchand P. Shende

(57) ABSTRACT

According to one embodiment, an electrostatic chuck includes a ceramic dielectric substrate, a base plate, and first and second electrode layers. The ceramic dielectric substrate includes first and second major surfaces. The first and second electrode layers are provided inside the ceramic dielectric substrate. The second electrode layer is provided between the first electrode layer and the first major surface. The first electrode layer includes first and second portions. The first portion is positioned more centrally of the ceramic dielectric substrate than is the second portion. The first portion includes first and second surfaces. The second portion includes third and fourth surfaces. The third surface is positioned between the first surface and the second electrode layer. An electrical resistance of the first surface is greater than an average electrical resistance of the first portion.

15 Claims, 9 Drawing Sheets

ELECTROSTATIC CHUCK

CROSS-REFERENCE TO RELATED APPLICATIONS

This application is based upon and claims the benefit of priority from Japanese Patent Application No. 2019-162313, filed on Sep. 5, 2019; the entire contents of which are incorporated herein by reference.

FIELD

Embodiments described herein relate generally to an electrostatic chuck.

BACKGROUND

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and attracts and holds a substrate such as a silicon wafer, etc., by an electrostatic force.

When performing plasma processing, for example, plasma is generated by applying a voltage from an RF (Radio Frequency) power supply (a high frequency power supply) to an upper electrode provided at an upper portion inside a chamber and to a lower electrode provided lower than the upper electrode.

In a conventional electrostatic chuck, the plasma is generated using, as the lower electrode, a base plate provided in a lower portion of the electrostatic chuck. However, the plasma controllability is limited in such a configuration because it is desirable to perform better control of the wafer in-plane distribution of the plasma density by selecting the appropriate frequency.

Therefore, in recent years, it is being attempted to increase the plasma controllability by providing a lower electrode for plasma generation built into a dielectric layer provided on a base plate. However, there are problems in that the in-plane uniformity of the plasma density may not be obtained sufficiently merely by providing the lower electrode built into the dielectric layer.

SUMMARY

According to the embodiment, an electrostatic chuck includes a ceramic dielectric substrate, a base plate, at least one first electrode layer, and at least one second electrode layer. The ceramic dielectric substrate includes a first major surface and a second major surface. The first major surface is configured to have an object placed thereon and clamped by the electrostatic chuck. The second major surface is at a side opposite to the first major surface. The base plate supports the ceramic dielectric substrate. The first electrode layer is provided inside the ceramic dielectric substrate. The first electrode layer is connected to a high frequency power supply from a side of the second major surface. The second electrode layer is provided inside the ceramic dielectric substrate. The second electrode layer is connected to a clamping power supply. The first electrode layer is provided between the first major surface and the second major surface in a Z-axis direction. The Z-axis direction extends from the base plate toward the ceramic dielectric substrate. The second electrode layer is provided between the first electrode layer and the first major surface in the Z-axis direction. The first electrode layer includes a first portion and second portion. The first portion is positioned more centrally of the ceramic dielectric substrate than is the second portion when projected onto a plane perpendicular to the Z-axis direction. The first portion includes a first surface at a side of the first major surface, and a second surface at a side opposite to the first surface. The second portion includes a third surface at the side of the first major surface, and a fourth surface at a side opposite to the third surface. The third surface is positioned between the first surface and the second electrode layer in the Z-axis direction. An electrical resistance of the first surface is greater than an average electrical resistance of the first portion.

DETAILED DESCRIPTION

Figure 1:
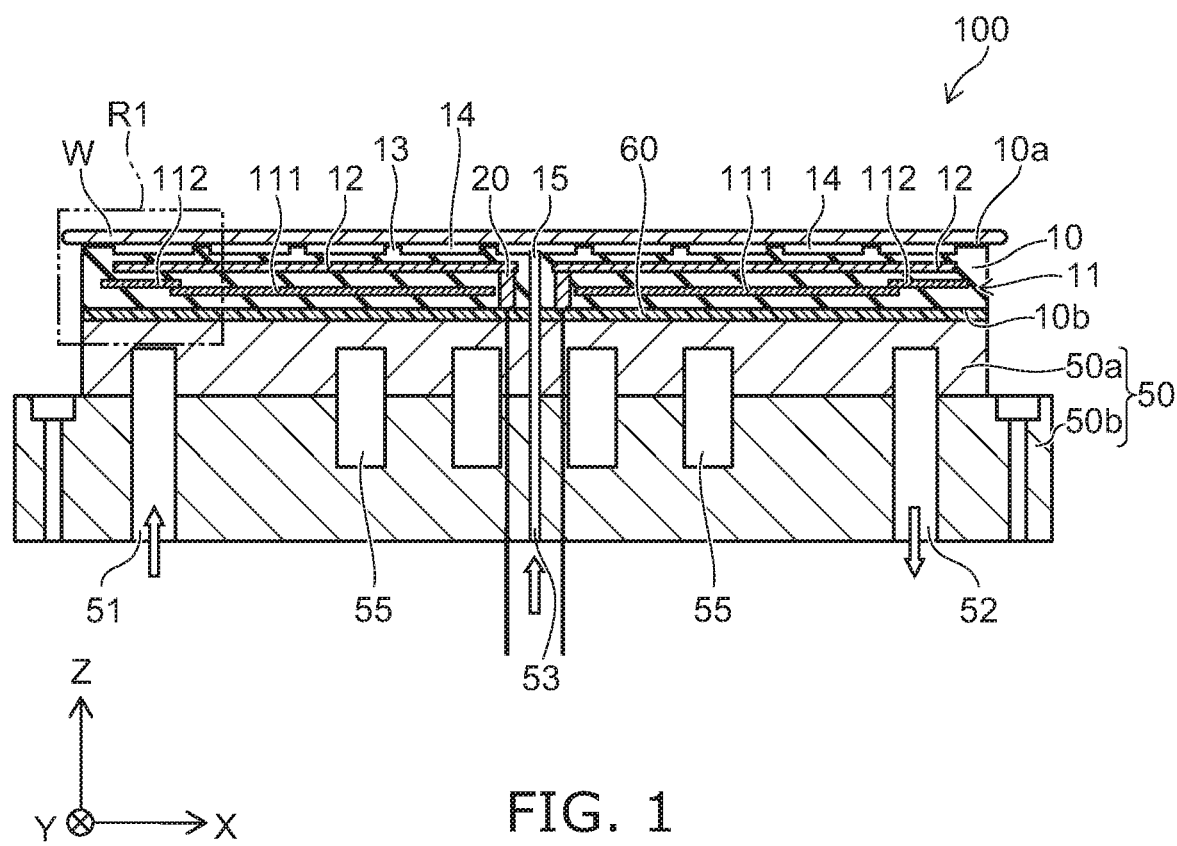
FIG. 1 is a cross-sectional view schematically illustrating an electrostatic chuck according to an embodiment.

A first invention is an electrostatic chuck including a ceramic dielectric substrate including a first major surface and a second major surface, a base plate supporting the ceramic dielectric substrate, at least one first electrode layer provided inside the ceramic dielectric substrate and connected to a high frequency power supply from a side of the second major surface, and at least one second electrode layer provided inside the ceramic dielectric substrate and connected to a clamping power supply; the first major surface is configured to have an object placed thereon and clamped by the electrostatic chuck; the second major surface is at a side opposite to the first major surface; the first electrode layer is provided between the first major surface and the second major surface in a Z-axis direction, which extends from the base plate toward the ceramic dielectric substrate; the second electrode layer is provided between the first electrode layer and the first major surface in the Z-axis direction; the first electrode layer includes a first portion and a second portion; the first portion is positioned more centrally of the ceramic dielectric substrate than is the second portion when projected onto a plane perpendicular to the Z-axis direction; the first portion includes a first surface at a side of the first major surface, and a second surface at a side opposite to the first surface; the second portion includes a third surface at the side of the first major surface, and a fourth surface at a side opposite to the third surface; the third surface is positioned between the first surface and the second electrode layer in the Z-axis direction; and an electrical resistance of the first surface is greater than an average electrical resistance of the first portion.

It is known that when a high frequency current is applied to an electrostatic chuck, the electric field strength is strong at the center vicinity of the electrode, and the electric field strength is weak at the outer circumference portion of the electrode. According to this electrostatic chuck, the first electrode layer includes the first portion positioned at the center vicinity of the first electrode layer when projected onto the plane perpendicular to the Z-axis direction, and the second portion positioned further toward the outer circumference side than the first portion when projected onto the plane perpendicular to the Z-axis direction. Also, the surface (the third surface) on the first major surface side of the second portion is positioned between the second electrode layer and the surface (the first surface) on the first major surface side of the first portion in the Z-axis direction. Thereby, the distance between the upper electrode and the first surface of the first portion positioned at the center vicinity of the first electrode layer can be greater than the distance between the upper electrode and the third surface of the second portion positioned at the outer circumference side of the first electrode layer, and the electric field strength can be reduced at the center vicinity (the first portion) of the first electrode layer at which the electric field strength easily becomes strong compared to the outer circumference portion (the second portion) of the first electrode layer. Accordingly, the plasma controllability can be increased, and the in-plane uniformity of the plasma density in the first electrode layer can be increased.

Also, a high frequency current propagates along the surface of the first electrode layer due to a skin effect; if the skin effect at the first surface of the first portion is strong, there is a risk that the current may concentrate at the center vicinity of the first surface, and the in-plane uniformity of the plasma density in the entire first electrode layer may decrease. According to this electrostatic chuck, the electrical resistance of the first surface of the first portion is set to be greater than the average electrical resistance of the first portion. Thereby, the skin effect at the first surface can be suppressed, and the concentration of the current toward the center of the first surface can be suppressed. Accordingly, the plasma controllability can be increased, and the in-plane uniformity of the plasma density in the first electrode layer can be increased.

A second invention is the electrostatic chuck of the first invention, wherein a surface roughness of the first surface is greater than a surface roughness of the second surface.

According to this electrostatic chuck, the concentration of the current toward the center of the first surface can be suppressed by setting the surface roughness of the first surface to be greater than the surface roughness of the second surface. Accordingly, the plasma controllability can be increased, and the in-plane uniformity of the plasma density in the first electrode layer can be increased.

A third invention is the electrostatic chuck of the first invention, wherein the first portion includes ceramic and metal, the first portion includes a first region including the first surface and a second region including the second surface, and a ceramic concentration of the first region is greater than an average ceramic concentration of the first portion.

According to this electrostatic chuck, the concentration of the current toward the center of the first surface can be suppressed by setting the ceramic concentration of the first region including the first surface to be greater than the average ceramic concentration of the first portion. Accordingly, the plasma controllability can be increased, and the in-plane uniformity of the plasma density in the first electrode layer can be increased.

A fourth invention is the electrostatic chuck of the third invention, wherein a ceramic concentration of the second region is greater than the average ceramic concentration of the first portion. According to this electrostatic chuck, by setting the ceramic concentration of the second region including the second surface to be greater than the average ceramic concentration of the first portion, detachment of the second region can be suppressed when a high frequency voltage is applied.

A fifth invention is the electrostatic chuck of the first invention, wherein the first portion includes a first region including the first surface and a second region including the second surface, and a porosity of the first region is greater than an average porosity of the first portion.

According to this electrostatic chuck, the concentration of the current toward the center of the first surface can be suppressed by setting the porosity of the first region including the first surface to be greater than the average porosity of the first portion. Accordingly, the plasma controllability can be increased, and the in-plane uniformity of the plasma density in the first electrode layer can be increased.

A sixth invention is the electrostatic chuck of the fifth invention, wherein a porosity of the second region is greater than the average porosity of the first portion.

According to this electrostatic chuck, by setting the porosity of the second region including the second surface to be greater than the average porosity of the first portion, the detachment of the second region when the high frequency voltage is applied can be suppressed. A seventh invention is the electrostatic chuck of any one of the first to sixth inventions, wherein a surface roughness of the third surface is greater than a surface roughness of the fourth surface.

According to this electrostatic chuck, by setting the surface roughness of the third surface to be greater than the surface roughness of the fourth surface, the skin effect at the third surface can be suppressed, and the concentration of the current toward the center of the third surface can be suppressed. Accordingly, the in-plane uniformity of the plasma density in the second portion also can be increased.

An eighth invention is the electrostatic chuck of any one of the first to sixth inventions, wherein a surface roughness of the third surface is less than a surface roughness of the fourth surface.

According to this electrostatic chuck, by setting the surface roughness of the third surface to be less than the surface roughness of the fourth surface, the skin effect at the third surface can be promoted, and the plasma density can be increased at the second portion at which the plasma density easily becomes sparse compared to the first portion. Accordingly, the in-plane uniformity of the plasma density in the first electrode layer can be increased.

A ninth invention is the electrostatic chuck of any one of the first to sixth inventions, wherein the second portion includes ceramic and metal, the second portion includes a third region including the third surface and a fourth region including the fourth surface, and a ceramic concentration of the third region is greater than an average ceramic concentration of the second portion.

According to this electrostatic chuck, by setting the ceramic concentration of the third region including the third surface to be greater than the average ceramic concentration of the second portion, the skin effect at the third surface can be suppressed, and the concentration of the current toward the center of the third surface can be suppressed. Accordingly, the in-plane uniformity of the plasma density in the second portion can be increased. Also, the distance between the second electrode layer and the second portion can be short; therefore, the impedance can be reduced, and the in-plane uniformity of the plasma density in the first electrode layer can be increased.

A tenth invention is the electrostatic chuck of any one of the first to sixth inventions, wherein the second portion includes ceramic and metal, the second portion includes a third region including the third surface and a fourth region including the fourth surface, and a metal concentration of the third region is greater than an average metal concentration of the second portion.

According to this electrostatic chuck, by setting the metal concentration of the third region including the third surface to be greater than the average metal concentration of the second portion, the skin effect at the third surface can be promoted, and the plasma density can be increased at the second portion at which the plasma density easily becomes sparse compared to the first portion.

Accordingly, the in-plane uniformity of the plasma density in the first electrode layer can be increased.

An eleventh invention is the electrostatic chuck of any one of the first to sixth inventions, wherein the second portion includes a third region including the third surface and a fourth region including the fourth surface, and a porosity of the third region is greater than an average porosity of the second portion.

According to this electrostatic chuck, by setting the porosity of the third region including the third surface to be greater than the average porosity of the second portion, the skin effect at the third surface can be suppressed, and the concentration of the current toward the center of the third surface can be suppressed. Accordingly, the in-plane uniformity of the plasma density in the second portion can be increased.

A twelfth invention is the electrostatic chuck of any one of the first to sixth inventions, wherein the second portion includes a third region including the third surface and a fourth region including the fourth surface, and a porosity of the third region is less than an average porosity of the second portion.

According to this electrostatic chuck, by setting the porosity of the third region including the third surface to be less than the average porosity of the second portion, the skin effect at the third surface can be promoted, and the plasma density can be increased in the second portion at which the plasma density easily becomes sparse compared to the first portion. Accordingly, the in-plane uniformity of the plasma density in the first electrode layer can be increased.

A thirteenth invention is the electrostatic chuck of any one of the first to sixth inventions, wherein a distance along the Z-axis direction between the fourth surface and the first major surface is constant, and a thickness of the second portion in the Z-axis direction between the third surface and the fourth surface varies such that the thickness at a circumferential end portion of the second portion which is less than the thickness at a central portion of the second portion.

According to this electrostatic chuck, the concentration of the electric field toward the circumferential end portion of the second portion can be suppressed by setting the distance along the Z-axis direction between the fourth surface and the first major surface to be constant and by setting the thickness of the second portion in the Z-axis direction between the third surface and the fourth surface to vary such that the thickness at the circumferential end portion of the second portion which is less than the thickness at the central portion of the second portion. Dielectric breakdown at the circumferential end portion of the second portion can be suppressed thereby.

A fourteenth invention is the electrostatic chuck of any one of the first to sixth inventions, wherein a distance along the Z-axis direction between the third surface and the first major surface is constant, and a thickness of the second portion in the Z-axis direction between the third surface and the fourth surface varies such that the thickness at a circumferential end portion of the second portion which is less than the thickness at a central portion of the second portion.

According to this electrostatic chuck, by setting the distance along the Z-axis direction between the third surface and the first major surface to be constant and by setting the thickness of the second portion in the Z-axis direction between the third surface and the fourth surface to vary such that the thickness at the circumferential end portion of the second portion which is less than the thickness at the central portion of the second portion, the electric field strength and the plasma density can be increased at the second portion at which the plasma density easily becomes sparse compared to the first portion. The in-plane uniformity of the plasma density in the first electrode layer can be increased thereby.

A fifteenth invention is the electrostatic chuck of the first invention, wherein a surface roughness of the third surface is different from a surface roughness of the fourth surface.

Embodiments of the invention will now be described with reference to the drawings. Similar components in the drawings are marked with the same reference numerals; and a detailed description is omitted as appropriate.

FIG. 1 is a cross-sectional view schematically illustrating an electrostatic chuck according to an embodiment.

As illustrated in FIG. 1, the electrostatic chuck 100 includes a ceramic dielectric substrate 10, a first electrode layer 11, a second electrode layer 12, and a base plate 50.

The ceramic dielectric substrate 10 is, for example, a base material having a flat plate configuration made of a sintered ceramic. For example, the ceramic dielectric substrate 10 includes aluminum oxide (alumina ($Al_2O_3$)). For example, the ceramic dielectric substrate 10 is formed of high-purity aluminum oxide. The concentration of the aluminum oxide in the ceramic dielectric substrate 10 is, for example, not less than 90 mass percent (mass %) and not more than 100 mass %, and favorably not less than 95 mass percent (mass %) and not more than 100 mass %, and more favorably not less than 99 mass percent (mass %) and not more than 100 mass %. By using high-purity aluminum oxide, the plasma resistance of the ceramic dielectric substrate 10 can be improved. The concentration of the aluminum oxide can be measured by fluorescent X-ray analysis, etc.

The ceramic dielectric substrate 10 has a first major surface 10a and a second major surface 10b. The first major surface 10a is a surface where a clamping object W is placed. The first major surface 10a is configured to have an object W placed thereon and clamped by the electrostatic chuck. The second major surface 10b is a surface on the side opposite to the first major surface 10a. The clamping object W is, for example, a semiconductor substrate such as a silicon wafer, etc.

In this specification, the direction from the base plate 50 toward the ceramic dielectric substrate 10 is taken as a Z-axis direction. The Z-axis direction extends from the base plate 50 toward the ceramic dielectric substrate 10. For example, as illustrated in the drawings, the Z-axis direction is the direction connecting the first major surface 10a and the second major surface 10b. The Z-axis direction is, for example, a direction substantially perpendicular to the first major surface 10a and the second major surface 10b. One direction orthogonal to the Z-axis direction is taken as an X-axis direction; and a direction orthogonal to the Z-axis direction and the X-axis direction is taken as a Y-axis direction. In this specification, "in the plane" is, for example, in the X-Y plane.

The first electrode layer 11 and the second electrode layer 12 are provided inside the ceramic dielectric substrate 10. The first electrode layer 11 and the second electrode layer 12 are provided between the first major surface 10a and the second major surface 10b. In other words, the first electrode layer 11 and the second electrode layer 12 are inserted into the ceramic dielectric substrate 10. For example, the first electrode layer 11 and the second electrode layer 12 may be built into the ceramic dielectric substrate 10 by sintering as one body.

The first electrode layer 11 is positioned between the first major surface 10a and the second major surface 10b in the Z-axis direction. The second electrode layer 12 is positioned between the first major surface 10a and the first electrode layer 11 in the Z-axis direction. In other words, the first electrode layer 11 is positioned between the second electrode layer 12 and the second major surface 10b in the Z-axis direction.

Thus, by providing the first electrode layer 11 inside the ceramic dielectric substrate 10, the distance between the first electrode layer 11 (the lower electrode) and the upper electrode (an upper electrode 510 of FIG. 10) that is provided higher than the electrostatic chuck 100 can be shortened. Thereby, for example, compared to when the base plate 50 is used as the lower electrode, etc., the plasma density can be increased with low electrical power. In other words, the electrical power that is necessary to obtain a high plasma density can be reduced.

The first electrode layer 11 and the second electrode layer 12 have thin-film configurations along the first major surface 10a and the second major surface 10b of the ceramic dielectric substrate 10. The configuration of the first electrode layer 11 is described below. The second electrode layer 12 is parallel to the first major surface 10a and the second major surface 10b. More specifically, the surface (the upper surface) on the first major surface 10a side (a side of the first major surface 10a) of the second electrode layer 12 and the surface (the lower surface) on the second major surface 10b side (a side of the second major surface 10b) of the second electrode layer 12 are respectively parallel to the first major surface 10a and the second major surface 10b.

The first electrode layer 11 is connected to a high frequency power supply (a high frequency power supply 504 of FIG. 10) from the side of the second major surface 10b. Plasma is generated inside a processing container 501 by a voltage (a high frequency voltage) being applied from the high frequency power supply to the first electrode layer 11 and the upper electrode (the upper electrode 510 of FIG. 10). In other words, the first electrode layer 11 is a lower electrode for generating the plasma. The high frequency power supply supplies a high frequency AC (alternating current) current to the first electrode layer 11. Here, "high frequency" is, for example, 200 kHz or more.

For example, the first electrode layer 11 is made of metal. The first electrode layer 11 includes, for example, at least one of Ag, Pd, or Pt. The first electrode layer 11 may include, for example, metal and ceramic.

Figure 10:
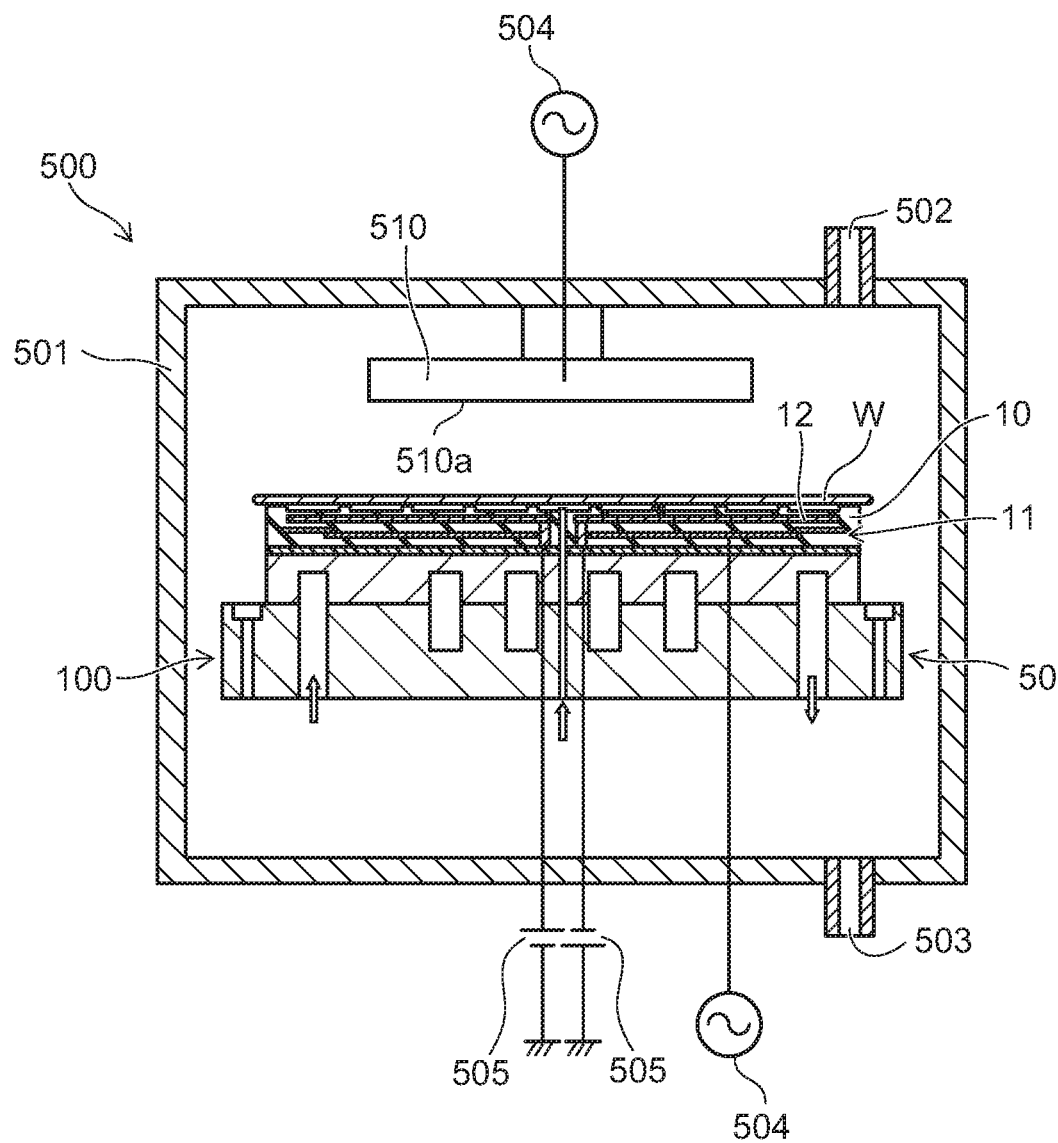
FIG. 10 is a cross-sectional view schematically illustrating a wafer processing apparatus including the electrostatic chuck according to the embodiment.

The second electrode layer 12 is connected to a clamping power supply (a clamping power supply 505 of FIG. 10). By applying a voltage (a clamping voltage) from the clamping power supply to the second electrode layer 12, the electrostatic chuck 100 generates a charge at the first major surface 10a side of the second electrode layer 12 and clamps the clamping object W by an electrostatic force. In other words, the second electrode layer 12 is a clamping electrode for clamping the clamping object W. The clamping power supply supplies a direct current (DC) current or an AC current to the second electrode layer 12. The clamping power supply is, for example, a DC power supply. The clamping power supply may be, for example, an AC power supply.

For example, the second electrode layer 12 is made of metal. The second electrode layer 12 includes, for example, at least one of Ag, Pd, Pt, Mo, or W. The second electrode layer 12 may include, for example, metal and ceramic.

A connection portion 20 that extends to the second major surface 10b side of the ceramic dielectric substrate 10 is provided at the second electrode layer 12. The connection portion 20 is, for example, a via (solid) or a via hole (hollow) that is electrically connected to the second electrode layer 12. The connection portion 20 may be a metal terminal connected by an appropriate method such as brazing, etc.

The base plate 50 is a member supporting the ceramic dielectric substrate 10. The ceramic dielectric substrate 10 is fixed on the base plate 50 by a bonding member 60. For example, a silicone bonding agent is used as the bonding member 60.

For example, the base plate 50 is made of metal such as aluminum, etc. For example, the base plate 50 may be made of ceramic. For example, the base plate 50 is divided into an upper portion 50a and a lower portion 50b; and a passageway 55 is provided between the upper portion 50a and the lower portion 50b. One end of the passageway 55 is connected to an input channel 51; and the other end of the passageway 55 is connected to an output channel 52.

The base plate 50 also performs the role of the temperature adjustment of the electrostatic chuck 100. For example, when cooling the electrostatic chuck 100, a cooling medium such as helium gas or the like is caused to inflow through the input channel 51, pass through the passageway 55, and outflow from the output channel 52. Thereby, the heat of the base plate 50 can be absorbed by the cooling medium; and the ceramic dielectric substrate 10 that is mounted on the base plate 50 can be cooled. On the other hand, when maintaining the temperature of the electrostatic chuck 100, it is also possible to introduce a heat-retaining medium into the passageway 55. It is also possible to provide a built-in heating element in the ceramic dielectric substrate 10 and/or the base plate 50. The temperature of the clamping object W held by the electrostatic chuck 100 can be adjusted by adjusting the temperature of the base plate 50 and/or the ceramic dielectric substrate 10.

In the example, a channel 14 is provided at the first major surface 10a side of the ceramic dielectric substrate 10. The channel 14 is recessed in the direction from the first major surface 10a toward the second major surface 10b (the Z-axis direction) and extends to be continuous in the X-Y plane. The portion where the channel 14 is not provided is taken as a protrusion 13; and the clamping object W is placed on the protrusion 13. The first major surface 10a is a surface contacting the back surface of the clamping object W. In other words, the first major surface 10a is a plane including the upper surface of the protrusion 13. A space is formed between the channel 14 and the back surface of the clamping object W placed on the electrostatic chuck 100.

The ceramic dielectric substrate 10 has a through-hole 15 connected to the channel 14. The through-hole 15 is provided from the second major surface 10b to the first major surface 10a. In other words, the through-hole 15 extends in the Z-axis direction from the second major surface 10b to the first major surface 10a and pierces the ceramic dielectric substrate 10.

The temperature of the clamping object W and/or the particles adhered to the clamping object W can be controlled to a favorable state by appropriately selecting the height of the protrusion 13 (the depth of the channel 14), the surface area ratio of the protrusion 13 and the channel 14, the shapes, etc.

A gas introduction channel 53 is provided in the base plate 50. For example, the gas introduction channel 53 is provided to pierce the base plate 50. The gas introduction channel 53 may not pierce through the base plate 50, and may be provided to reach the ceramic dielectric substrate 10 side by branching partway into other gas introduction channels 53. The gas introduction channel 53 may be provided in multiple locations of the base plate 50.

The gas introduction channel 53 communicates with the through-hole 15. In other words, the transfer gas (helium (He) or the like) that inflows into the gas introduction channel 53 inflows into the through-hole 15 after passing through the gas introduction channel 53.

The transfer gas that inflows into the through-hole 15 inflows into the space provided between the clamping object W and the channel 14 after passing through the through-hole 15. Thereby, the clamping object W can be directly cooled by the transfer gas.

Figure 2:
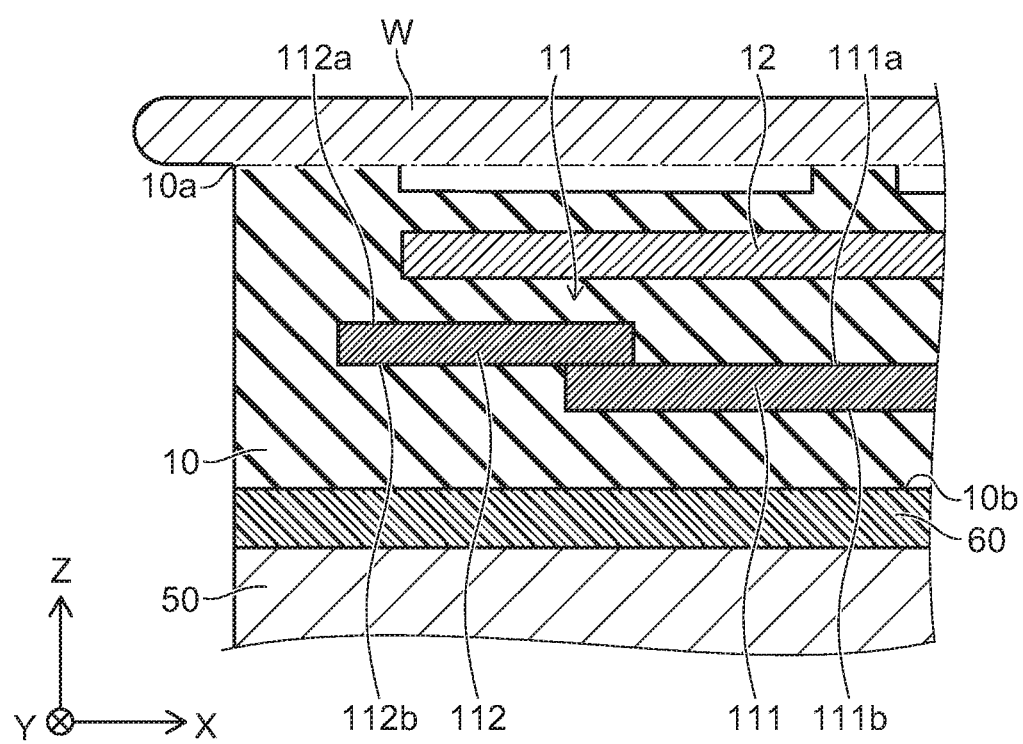
FIG. 2 is an enlarged cross-sectional view schematically illustrating a portion of the electrostatic chuck according to the embodiment.

FIG. 2 is an enlarged cross-sectional view schematically illustrating a portion of the electrostatic chuck according to the embodiment.

Figure 3A:
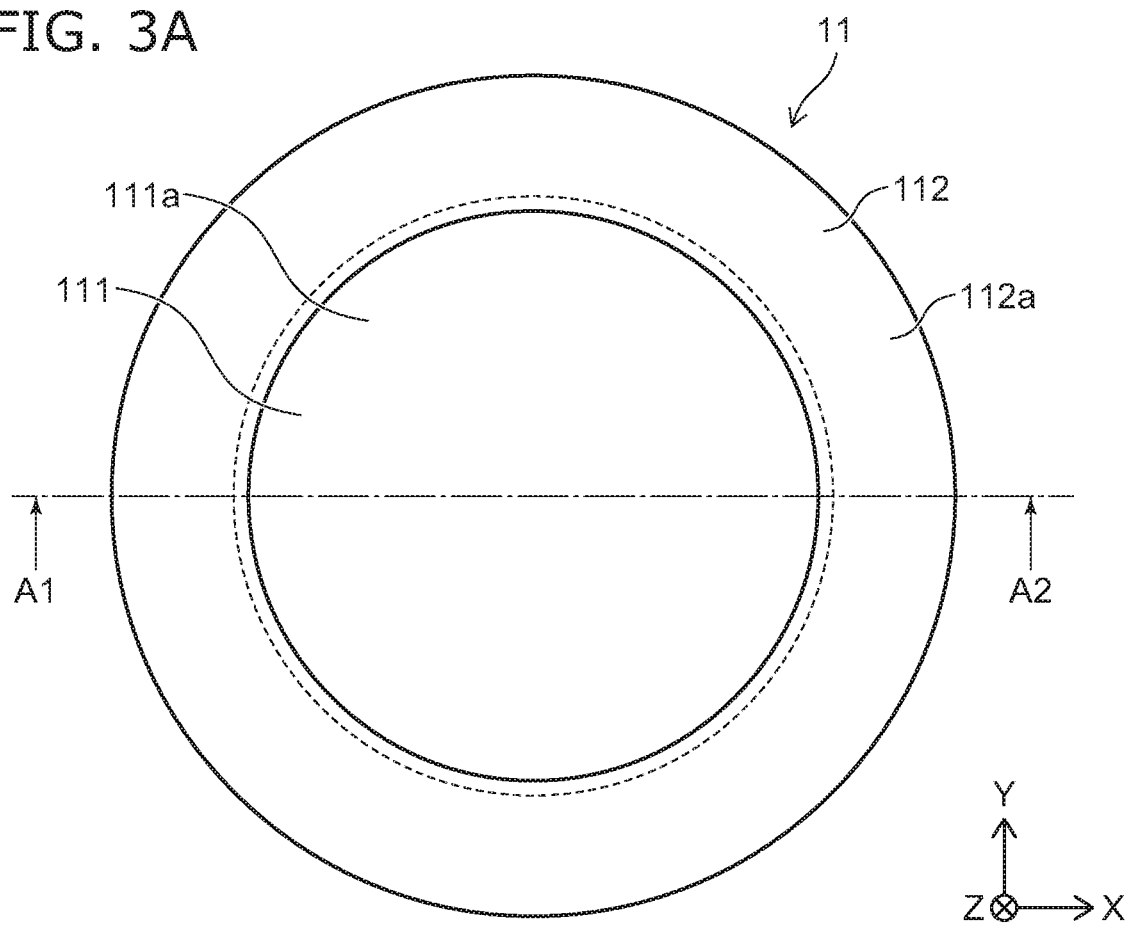
FIGS. 3A and 3B are a plan view and a cross-sectional view schematically illustrating an example of the first electrode layer of the electrostatic chuck according to the embodiment.
Figure 3B:
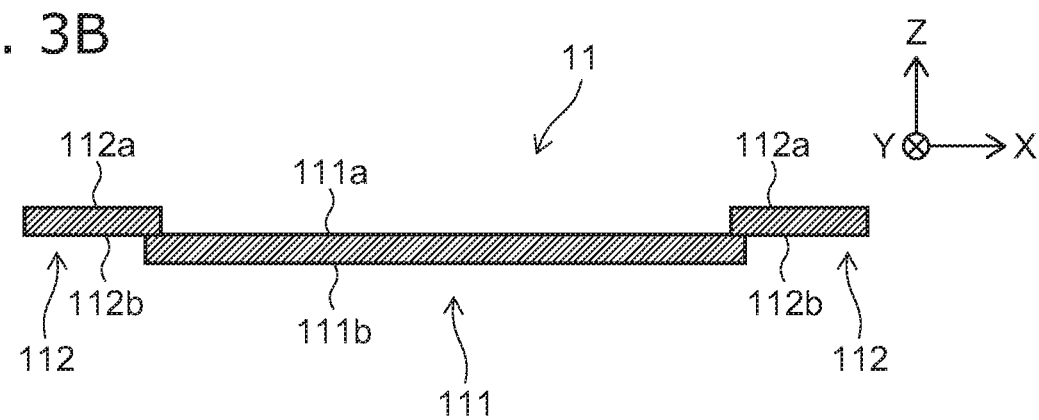

FIGS. 3A and 3B are a plan view and a cross-sectional view schematically illustrating an example of the first electrode layer of the electrostatic chuck according to the embodiment.

Figure 4A:
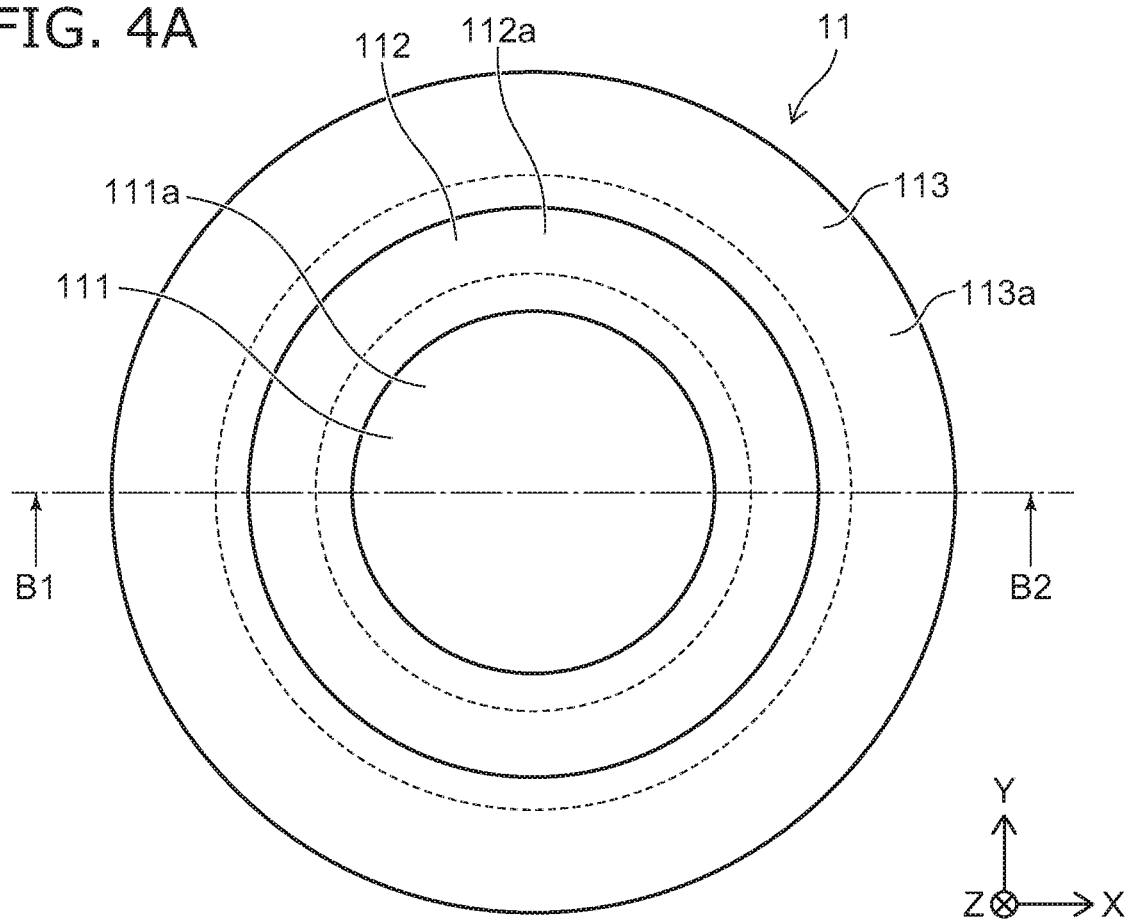
FIGS. 4A and 4B are a plan view and a cross-sectional view schematically illustrating another example of the first electrode layer of the electrostatic chuck according to the embodiment.
Figure 4B:
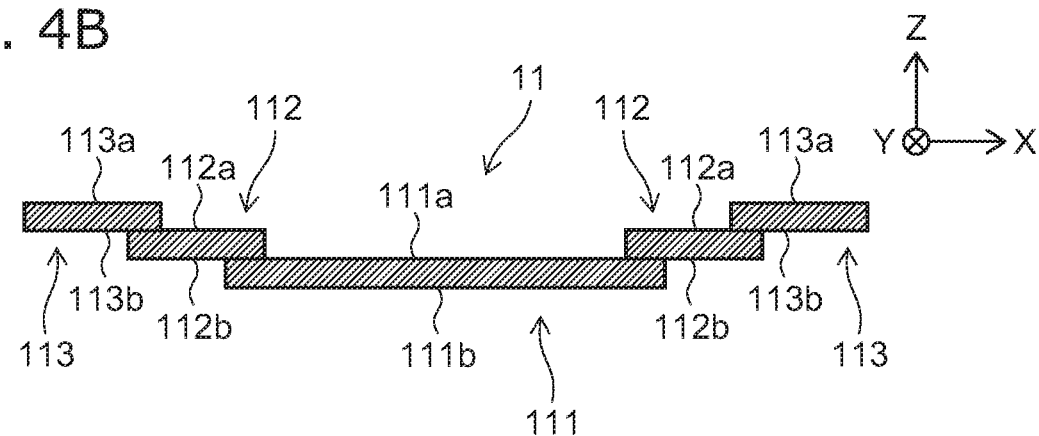

FIGS. 4A and 4B are a plan view and a cross-sectional view schematically illustrating another example of the first electrode layer of the electrostatic chuck according to the embodiment.

Figure 5A:
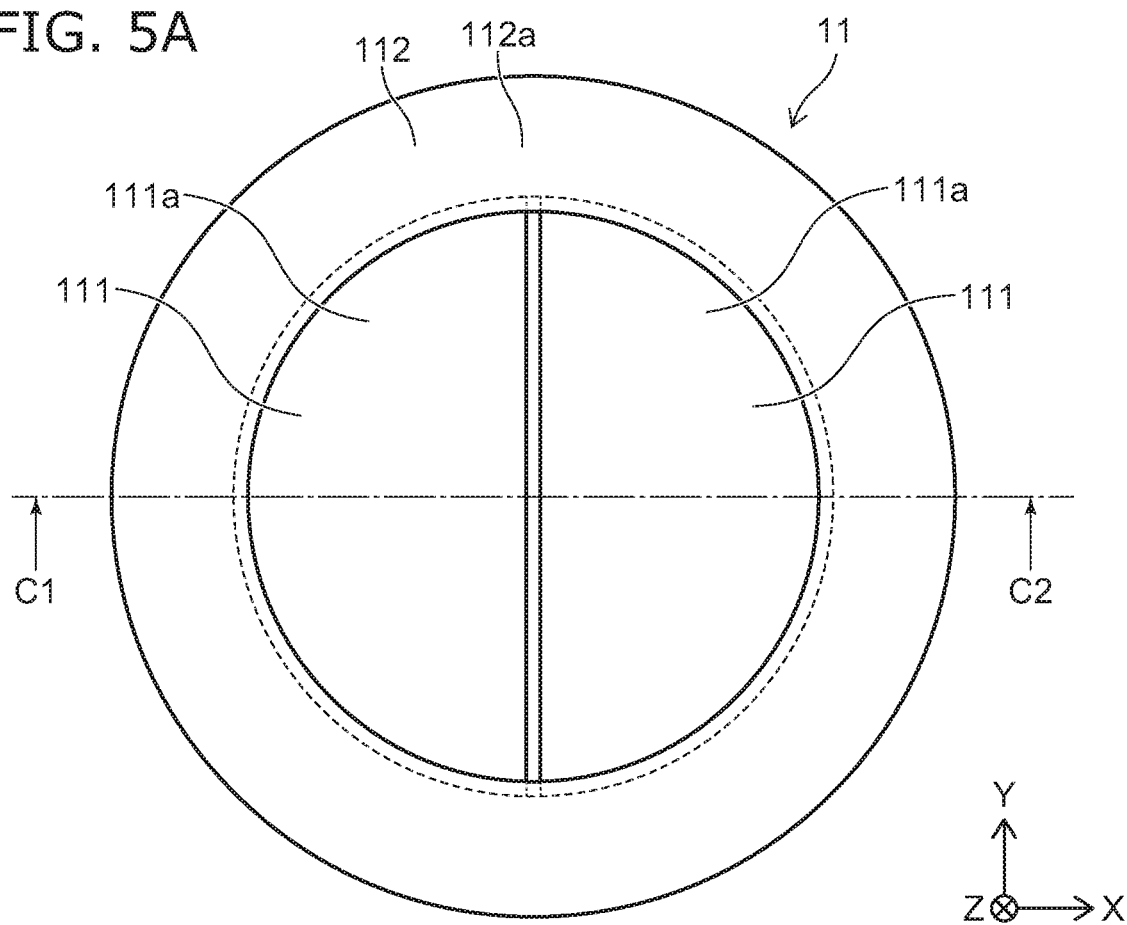
FIGS. 5A and 5B are a plan view and a cross-sectional view schematically illustrating another example of the first electrode layer of the electrostatic chuck according to the embodiment.
Figure 5B:
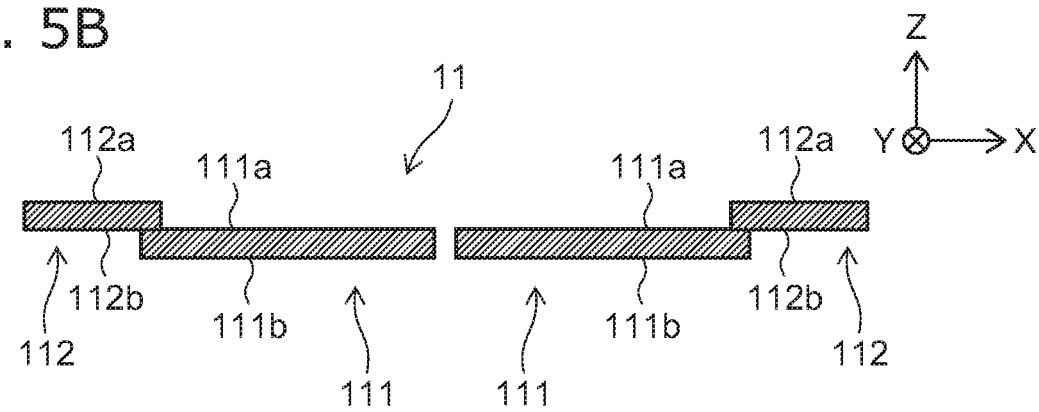

FIGS. 5A and 5B are a plan view and a cross-sectional view schematically illustrating another example of the first electrode layer of the electrostatic chuck according to the embodiment.

Region R1 shown in FIG. 1 is enlarged in FIG. 2.

FIG. 3B is a cross-sectional view along line A1-A2 shown in FIG. 3A. FIG. 4B is a cross-sectional view along line B1-B2 shown in FIG. 4A. FIG. 5B is a cross-sectional view along line C1-C2 shown in FIG. 5A.

The holes through which the gas inlet path 53 and the connection part 20 are inserted are not illustrated in FIGS. 3A, 3B, 4A, 4B, 5A, and 5B.

As illustrated in FIGS. 2, 3A, 3B, 4A, 4B, 5A, and 5B, the first electrode layer 11 includes a first portion 111 and a second portion 112. The first portion 111 is positioned at the center vicinity of the first electrode layer 11 when projected onto a plane (the X-Y plane) perpendicular to the Z-axis direction. The second portion 112 is positioned further toward the outer circumference side of the first electrode layer 11 than the first portion 111 when projected onto the plane perpendicular to the Z-axis direction. The first portion 111 is positioned more centrally of the ceramic dielectric substrate 10 than is the second portion 112. In other words, the first portion 111 is positioned inward in the X-Y plane, and the second portion 112 is positioned outward in the X-Y plane. For example, the first portion 111 is provided at a position overlapping the center of the electrostatic chuck 100 when projected onto the plane perpendicular to the Z-axis direction.

The first portion 111 includes a first surface 111a and a second surface 111b. The first surface 111a is the surface on the first major surface 10a side. The second surface 111b is the surface on the side opposite to the first surface 111a. In other words, the first surface 111a is the surface facing the second electrode layer 12. In other words, the second surface 111b is the surface on the second major surface 10b side. In the example, the first surface 111a and the second surface 111b are parallel to each other. Also, the first surface 111a and the second surface 111b each are parallel to the first major surface 10a.

The second portion 112 includes a third surface 112a and a fourth surface 112b. The third surface 112a is the surface on the first major surface 10a side. The fourth surface 112b is the surface on the side opposite to the third surface 112a. In other words, the third surface 112a is the surface facing the second electrode layer 12. In other words, the fourth surface 112b is the surface on the second major surface 10b side. In the example, the third surface 112a and the fourth surface 112b are parallel to each other. Also, the third surface 112a and the fourth surface 112b each are parallel to the first major surface 10a.

In this specification, the state in which two surfaces are parallel can include, for example, the waviness of the surfaces, etc. For example, two surfaces can be considered to be "parallel" when the distance between the two surfaces is substantially constant when the cross section of the electrostatic chuck 100 is observed with a scanning electron microscope (SEM) or the like at a low magnification (e.g., about 100 times).

The third surface 112a is positioned between the first surface 111a and the second electrode layer 12 in the Z-axis direction. That is, the distance along the Z-axis direction between the first portion 111 (the first surface 111a) and the first major surface 10a is greater than the distance along the Z-axis direction between the second portion 112 (the third surface 112a) and the first major surface 10a. Accordingly, the distance between the first portion 111 (the first surface 111a) and the upper electrode is greater than the distance between the second portion 112 (the third surface 112a) and the upper electrode.

Thereby, the electric field strength can be reduced at the center vicinity (the first portion 111) of the first electrode layer 11 at which the electric field strength easily becomes strong compared to the outer circumference portion (the second portion 112) of the first electrode layer 11. In other words, the plasma density can be increased at the outer circumference portion (the second portion 112) of the first electrode layer 11 at which the plasma density easily becomes sparse compared to the center vicinity (the first portion 111) of the first electrode layer 11. Accordingly, the plasma controllability can be increased, and the in-plane uniformity of the plasma density in the first electrode layer 11 can be increased.

The high frequency current is supplied to the first electrode layer 11 from the surface on the second major surface 10b side (e.g., the second surface 111b, the fourth surface 112b, etc.). Normally, when an AC current flows through an electrode layer, the current flows by concentrating at the surface vicinity of the electrode layer and does not easily flow through the interior of the electrode layer. The surface concentration of the current becomes pronounced as the high frequency of the AC current that flows increases. That is, the high frequency AC current that flows into the first electrode layer 11 from the surface on the second major surface 10b side (e.g., the second surface 111b, the fourth surface 112b, etc.) flows into the surface on the first major surface 10a side (e.g., the first surface 111a, the third surface 112a, etc.) via the surface on the second major surface 10b side of the first electrode layer 11 (e.g., the second surface 111b, the fourth surface 112b, etc.). If the skin effect at the first surface 111a is strong at this time, there is a risk that the current may concentrate at the center vicinity of the first surface 111a, and the in-plane uniformity of the plasma density in the entire first electrode layer 11 may decrease.

Conversely, in the embodiment, the electrical resistance of the first surface 111a is set to be greater than the average electrical resistance of the first portion 111. Thereby, the skin effect at the first surface 111a can be suppressed, and the concentration of the current toward the center of the first surface 111a can be suppressed.

Accordingly, the plasma controllability can be increased, and the in-plane uniformity of the plasma density in the first electrode layer 11 can be increased.

In the embodiment, the electrical resistance of the first surface 111a can be determined by the following method. First, holes are made from the first major surface 10a side of the ceramic dielectric substrate 10 in which the first electrode layer 11 is embedded, and portions of the first surface 111a of the first portion 111 are exposed. At this time, holes are made in two locations, i.e., one X-axis direction end and the other X-axis direction end of the first surface 111a. Measurement terminals are caused to contact the exposed portions from the first surface 111a side, and the electrical resistance between the two points is measured. The electrical resistances of the second surface 111b, the third surface 112a, the fourth surface 112b, etc., also can be determined by a method similar to that described above.

The average electrical resistance of the first portion 111 can be determined by the following method. First, a hole is made from the first major surface 10a side of the ceramic dielectric substrate 10 in which the first electrode layer 11 is embedded, and a portion of the first surface 111a of the first portion 111 is exposed. At this time, the hole is made at one X-axis direction end of the first surface 111a. Then, a hole is made from the second major surface 10b side of the ceramic dielectric substrate 10 in which the first electrode layer 11 is embedded, and a portion of the second surface 111b of the first portion 111 is exposed. At this time, the hole is made at the other X-axis direction end of the second surface 111b. A measurement terminal is caused to contact the exposed portion of the first surface 111a from the first surface 111a side, a measurement terminal is caused to contact the exposed portion of the second surface 111b from the second surface 111b side, and the electrical resistance between the two points is measured.

The average electrical resistance of the first portion 111 may be the average value of the electrical resistance of the first surface 111a and the electrical resistance of the second surface 111b. That is, the average value of the electrical resistance of the first surface 111a determined by the method described above and the electrical resistance of the second surface 111b determined by a method similar to that described above may be considered to be the average electrical resistance of the first portion 111. The average electrical resistance of the second portion 112 also can be determined by a method similar to that described above.

The electrical resistance of the first surface 111a is, for example, not less than $5 \times 10^{-6} \Omega$ and not more than $1 \times 10^{-4} \Omega$. The average electrical resistance of the first portion 111 is, for example, not less than $1 \times 10^{-6} \Omega$ and not more than $5 \times 10^{-5} \Omega$.

As illustrated in FIGS. 3A, 4A, and 5A, the first portion 111 may be monopolar or bipolar. When the first portion 111 is monopolar, one first portion 111 that spreads along the X-Y plane is provided as illustrated in FIGS. 3A and 4A. For example, the first portion 111 is substantially circular when viewed along the Z-axis direction. On the other hand, when the first portion 111 is bipolar, two first portions 111 that spread along the X-Y plane and are positioned to be coplanar are provided as illustrated in FIG. 5A. For example, the two first portions 111 each are substantially semicircular when viewed along the Z-axis direction.

As illustrated in FIGS. 3A, 3B, 4A, 4B, 5A, and 5B, for example, the second portion 112 has a ring configuration surrounding the first portion 111 when viewed along the Z-axis direction. In these examples, a portion of the second portion 112 overlaps the first portion 111 in the Z-axis direction. In these examples, the second portion 112 does not overlap the first portion 111 in the X-axis direction or the Y-axis direction. In these examples, the second portion 112 is electrically connected to the first portion 111. In these examples, the second portion 112 is directly connected to the first portion 111. In other words, the second portion 112 contacts the first portion 111. The arrangement of the first and second portions 111 and 112 is not limited thereto. Other examples of the arrangement of the first and second portions 111 and 112 are described below.

As illustrated in FIGS. 4A and 4B, the first electrode layer 11 may include one or more portions positioned further toward the outer circumference side of the first electrode layer 11 than the second portion 112 when projected onto the plane perpendicular to the Z-axis direction. In the example, the first electrode layer 11 further includes a third portion 113. The third portion 113 is positioned further toward the outer circumference side of the first electrode layer 11 than the second portion 112 when projected onto the plane perpendicular to the Z-axis direction. The third portion 113 has a ring configuration surrounding the second portion 112 when viewed along the Z-axis direction.

The third portion 113 includes a fifth surface 113a and a sixth surface 113b. The fifth surface 113a is the surface on the first major surface 10a side. The sixth surface 113b is the surface on the side opposite to the fifth surface 113a. In other words, the fifth surface 113a is the surface facing the second electrode layer 12. In other words, the sixth surface 113b is the surface on the second major surface 10b side. In the example, the fifth surface 113a and the sixth surface 113b are parallel to each other. Also, the fifth surface 113a and the sixth surface 113b each are parallel to the first major surface 10a. The fifth surface 113a is positioned between the third surface 112a and the second electrode layer 12 in the Z-axis direction.

FIGS. 6A to 6E are cross-sectional views illustrating examples of the arrangement of the first and second portions of the electrostatic chuck according to the embodiment.

As described above, it is sufficient for the first portion 111 and the second portion 112 to be disposed so that the third surface 112a of the second portion 112 is positioned between the second electrode layer 12 and the first surface 111a of the first portion 111 in the Z-axis direction; and the arrangement of the first and second portions 111 and 112 is modifiable as appropriate.

Figure 6A:
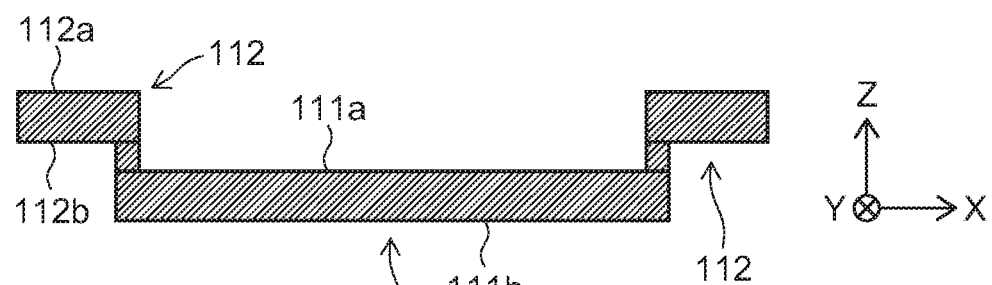
FIGS. 6A to 6E are cross-sectional views illustrating examples of the arrangement of the first and second portions of the electrostatic chuck according to the embodiment.
Figure 6B:
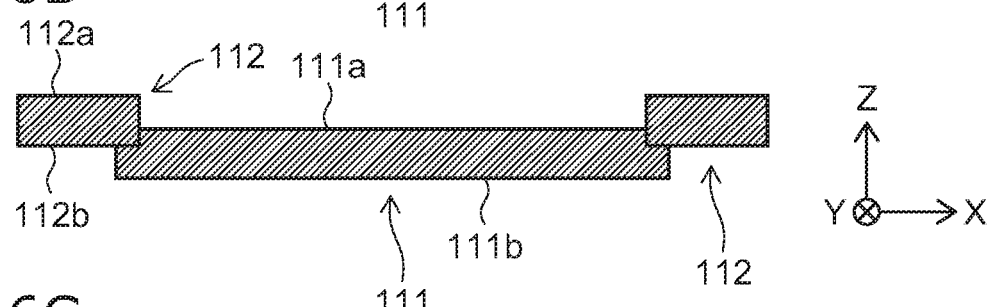
Figure 6C:
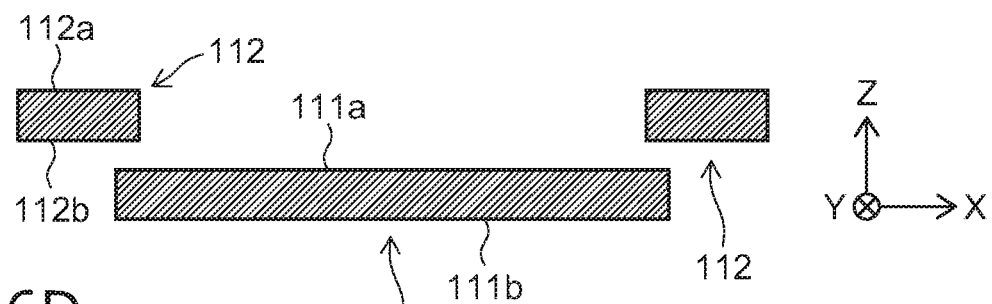
Figure 6D:
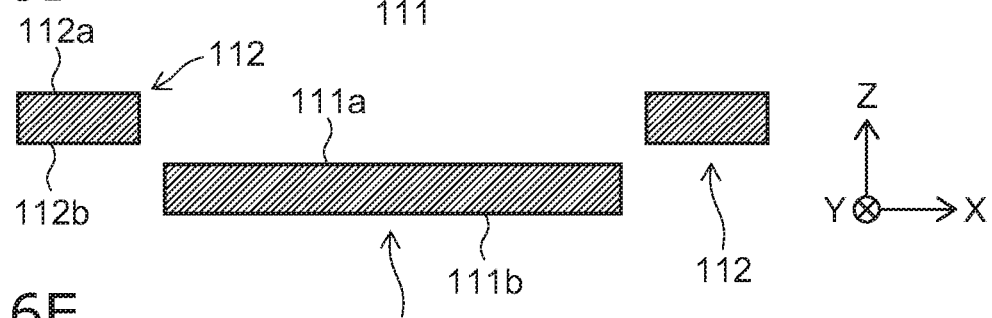
Figure 6E:
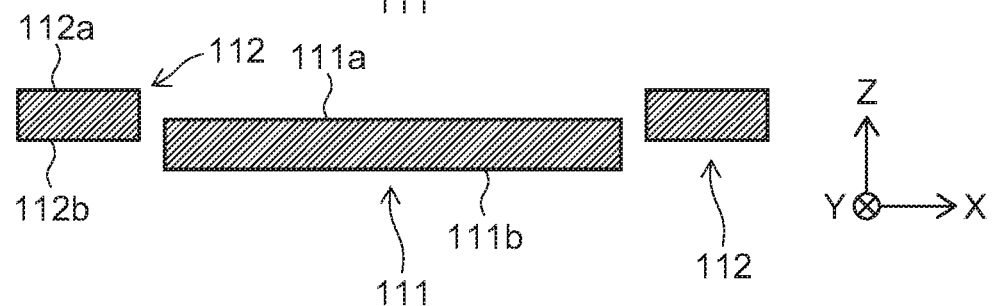

As illustrated in FIGS. 6A to 6C, a portion of the second portion 112 may overlap the first portion 111 in the Z-axis direction. As illustrated in FIGS. 6D and 6E, the second portion 112 may not overlap the first portion 111 in the Z-axis direction.

As illustrated in FIGS. 6B and 6E, a portion of the second portion 112 may overlap the first portion 111 in the X-axis direction or the Y-axis direction. As illustrated in FIGS. 6A, 6C, and 6D, the second portion 112 may not overlap the first portion 111 in the X-axis direction or the Y-axis direction.

As illustrated in FIGS. 6A and 6B, the second portion 112 may be electrically connected to the first portion 111. In such a case, the electrical connection between the first portion 111 and the second portion 112 may be a direct connection as illustrated in FIG. 6B or an indirect connection as illustrated in FIG. 6A. In other words, the first portion 111 and the second portion 112 may be electrically connected via a connection member made of a conductor. By electrically connecting the first portion 111 and the second portion 112, the first portion 111 and the second portion 112 can be collectively controlled.

As illustrated in FIGS. 6C, 6D, and 6E, the second portion 112 may not be electrically connected to the first portion 111. By not electrically connecting the first portion 111 and the second portion 112, the first portion 111 and the second portion 112 can be separately controlled.

In the examples of FIGS. 6A to 6E, the fourth surface 112b is positioned between the third surface 112a and the second surface 111b in the Z-axis direction. For example, the fourth surface 112b may be positioned in the same plane as the second surface 111b. Also, for example, the second surface 111b may be positioned between the third surface 112a and the fourth surface 112b in the Z-axis direction.

In the examples of FIGS. 6A to 6E, the distance along the Z-axis direction between the third surface 112a and the fourth surface 112b (the thickness of the second portion 112) is equal to the distance along the Z-axis direction between the first surface 111a and the second surface 111b (the thickness of the first portion 111). The thickness of the second portion 112 may be greater than the thickness of the first portion 111 or less than the thickness of the first portion 111.

Figure 7A:
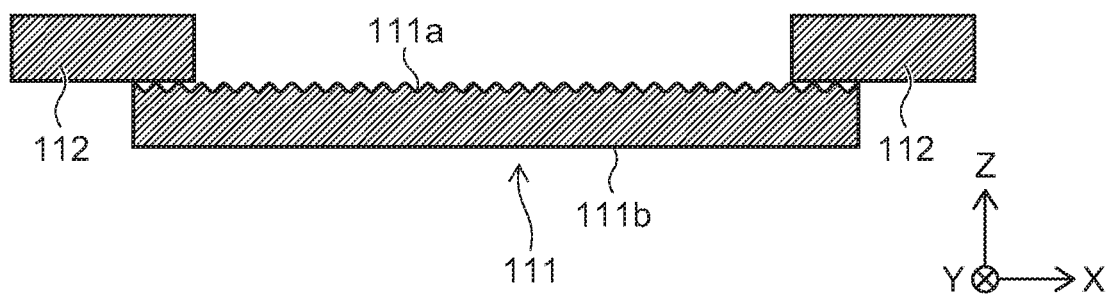
FIGS. 7A to 7C are cross-sectional views schematically illustrating examples of the first portion of the electrostatic chuck according to the embodiment.
Figure 7B:
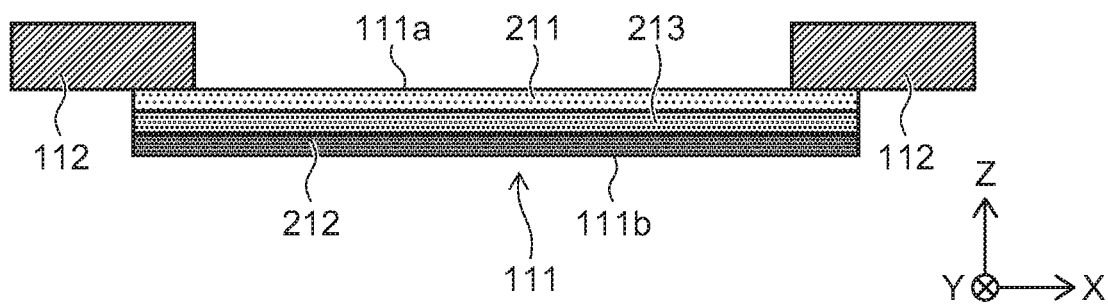
Figure 7C:
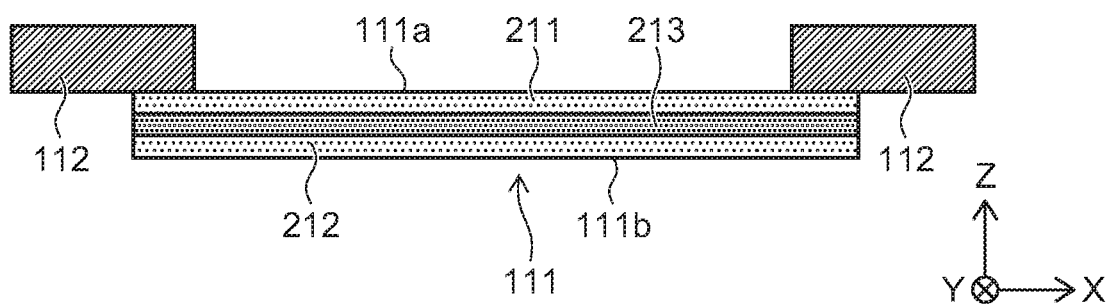

FIGS. 7A to 7C are cross-sectional views schematically illustrating examples of the first portion of the electrostatic chuck according to the embodiment.

As illustrated in FIG. 7A, the surface roughness of the first surface 111a is, for example, greater than the surface roughness of the second surface 111b. The surface roughness of the first surface 111a is, for example, not less than 0.2 μm and not more than 20 μm. The surface roughness of the second surface 111b is, for example, not less than 0.1 μm and not more than 10 μm. In this specification, the surface roughness means, for example, the arithmetic average roughness (Ra) and can be calculated by the following method.

A portion of the electrostatic chuck 100 is cut out to include the first electrode layer 11, is embedded in a resin, polished, and subsequently observed with a SEM (Scanning Electron Microscope). The arithmetic average roughness Ra is calculated from a SEM image that is imaged at 100 to 1000 times using a method conforming to JIS B 0601:2013. The surface roughness of the first surface 111a is calculated using a contour curve along the interface between the first surface 111a of the first portion 111 and the ceramic dielectric substrate 10 or voids (pores). The surface roughness of the second surface 111b is calculated using a contour curve along the interface between the second surface 111b of the first portion 111 and the ceramic dielectric substrate 10 or voids (pores). The surface roughnesses of the third surface 112a, the fourth surface 112b, etc., also can be determined by a method similar to that described above.

Thus, the concentration of the current toward the center of the first surface 111a can be suppressed by setting the surface roughness of the first surface 111a to be greater than the surface roughness of the second surface 111b. Accordingly, the plasma controllability can be increased, and the in-plane uniformity of the plasma density in the first electrode layer 11 can be increased.

As illustrated in FIGS. 7B and 7C, the first portion 111 includes, for example, a first region 211, a second region 212, and an intermediate region 213. The first region 211 includes the first surface 111a. The second region 212 includes the second surface 111b. The intermediate region 213 is positioned between the first region 211 and the second region 212 in the Z-axis direction. The intermediate region 213 is provided as necessary and is omissible.

When the first portion 111 includes ceramic and metal, the ceramic concentration of the first region 211 is, for example, greater than the average ceramic concentration of the first portion 111 as illustrated in FIGS. 7B and 7C. In other words, the metal concentration of the first region 211 is, for example, less than the average metal concentration of the first portion 111. The ceramic concentration of the first region 211 is, for example, not less than 20% and not more than 70%. The average ceramic concentration of the first portion 111 is, for example, not less than 10% and not more than 60%.

In FIGS. 7B and 7C, the ceramic concentration and the metal concentration are illustrated by the shading of the color. More specifically, the color is darker as the ceramic concentration decreases (the metal concentration increases), and the color is lighter as the ceramic concentration increases (the metal concentration decreases). In the embodiment, the ceramic concentration and the metal concentration of each region of the first portion 111 can be determined by image analysis by observing a cross section of each region of the first portion 111 by SEM-EDX (Energy Dispersive X-ray Spectroscopy). More specifically, the ceramic concentration and the metal concentration can be calculated by acquiring a cross section SEM-EDX image of each region of the first portion 111, classifying into ceramic and metal by EDX component analysis, and by using image analysis to determine the surface area ratio of the ceramic and the metal. The ceramic concentration and the metal concentration of each region of the second portion 112 also can be determined by a method similar to that described above.

The average ceramic concentration of the first portion 111 can be calculated as the average value of the ceramic concentration of the first region 211, the ceramic concentration of the second region 212, and the ceramic concentration of the intermediate region 213 that are determined by the method described above. The average metal concentration of the first portion 111 can be calculated as the average value of the metal concentration of the first region 211, the metal concentration of the second region 212, and the metal concentration of the intermediate region 213 that are determined by the method described above.

Thus, the concentration of the current toward the center of the first surface 111a can be suppressed by setting the ceramic concentration of the first region 211 including the first surface 111a to be greater than the average ceramic concentration of the first portion 111. Accordingly, the plasma controllability can be increased, and the in-plane uniformity of the plasma density in the first electrode layer 11 can be increased.

As illustrated in FIG. 7C, the ceramic concentration of the second region 212 is, for example, greater than the average ceramic concentration of the first portion 111. In other words, the metal concentration of the second region 212 is, for example, less than the average metal concentration of the first portion 111. The ceramic concentration of the second region 212 is, for example, not less than 20% and not more than 70%.

Thus, by setting the ceramic concentration of the second region 212 including the second surface 111b to be greater than the average ceramic concentration of the first portion 111, the detachment of the second region 212 when the high frequency voltage is applied can be suppressed.

As illustrated in FIG. 7B, the ceramic concentration of the second region 212 may be less than the average ceramic concentration of the first portion 111. In other words, the metal concentration of the second region 212 may be, for example, greater than the average metal concentration of the first portion 111.

As illustrated in FIGS. 7B and 7C, the porosity of the first region 211 is, for example, greater than the average porosity of the first portion 111. The porosity of the first region 211 is, for example, not less than 2% and not more than 40%. The average porosity of the first portion 111 is, for example, not less than 1% and not more than 30%.

In FIGS. 7B and 7C, the porosity is illustrated by the shading of the color. More specifically, the color is darker as the porosity decreases, and the color is lighter as the porosity increases.

In the embodiment, the porosity of each region of the first portion 111 can be determined by embedding in a resin a cross section of the sample to be measured, polishing the sample cross section until the sample cross section surface is a mirror surface, imaging using a SEM (Scanning Electron Microscope), and performing image analysis of the acquired image. More specifically, the first portion 111 is cut, embedded in a resin, and mechanically polished until the cross-sectional direction can be observed by SEM. The cross section is polished until the cross section has a mirror surface, Pt is vapor-deposited on the sample, and SEM observation is performed. The observation magnification is set to 500 times, and five fields per region are observed to ascertain the structure fluctuation of the sample. The SEM observation image is analyzed using the commercial two-dimensional image analysis software "Win Roof", and the pores are quantified. The values of the five fields are averaged and used as the porosity. The porosity of each region of the second portion 112 also can be determined using a method similar to that described above.

The average porosity of the first portion 111 can be calculated as the average value of the porosity of the first region 211, the porosity of the second region 212, and the porosity of the intermediate region 213 that are determined by the method described above.

Thus, the concentration of the current toward the center of the first surface 111a can be suppressed by setting the porosity of the first region 211 including the first surface 111a to be greater than the average porosity of the first portion 111. Accordingly, the plasma controllability can be increased, and the in-plane uniformity of the plasma density in the first electrode layer 11 can be increased.

As illustrated in FIG. 7C, the porosity of the second region 212 is, for example, greater than the average porosity of the first portion 111. The porosity of the second region 212 is, for example, not less than 2% and not more than 40%.

Thus, by setting the porosity of the second region 212 including the second surface 111b to be greater than the average porosity of the first portion 111, the detachment of the second region 212 when the high frequency voltage is applied can be suppressed.

As illustrated in FIG. 7B, the porosity of the second region 212 may be less than the average porosity of the first portion 111.

FIGS. 8A to 8D are cross-sectional views schematically illustrating examples of the second portion of the electrostatic chuck according to the embodiment.

Figure 8A:
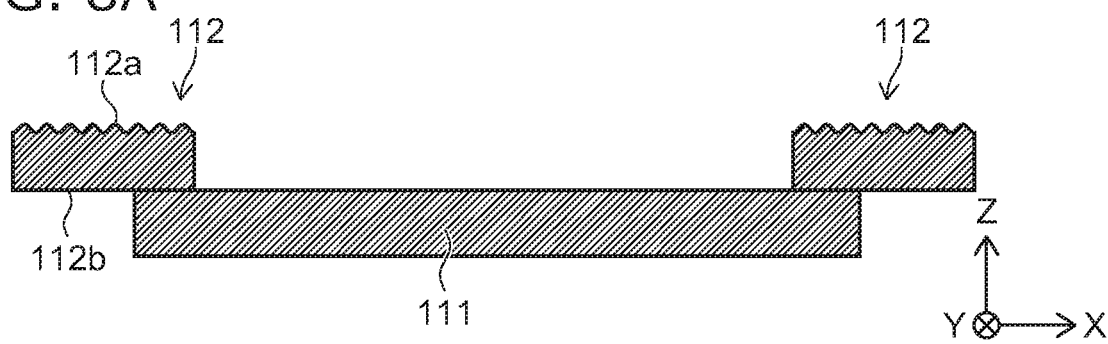
FIGS. 8A to 8D are cross-sectional views schematically illustrating examples of the second portion of the electrostatic chuck according to the embodiment.

As illustrated in FIG. 8A, the surface roughness of the third surface 112a is, for example, greater than the surface roughness of the fourth surface 112b. In such a case, the surface roughness of the third surface 112a is, for example, not less than 0.2 μm and not more than 20 μm. The surface roughness of the fourth surface 112b is, for example, not less than 0.1 μm and not more than 10 μm.

Thus, by setting the surface roughness of the third surface 112a to be greater than the surface roughness of the fourth surface 112b, the skin effect at the third surface 112a can be suppressed, and the concentration of the current toward the center of the third surface 112a can be suppressed. Accordingly, the in-plane uniformity of the plasma density in the second portion 112 also can be increased.

Figure 8B:
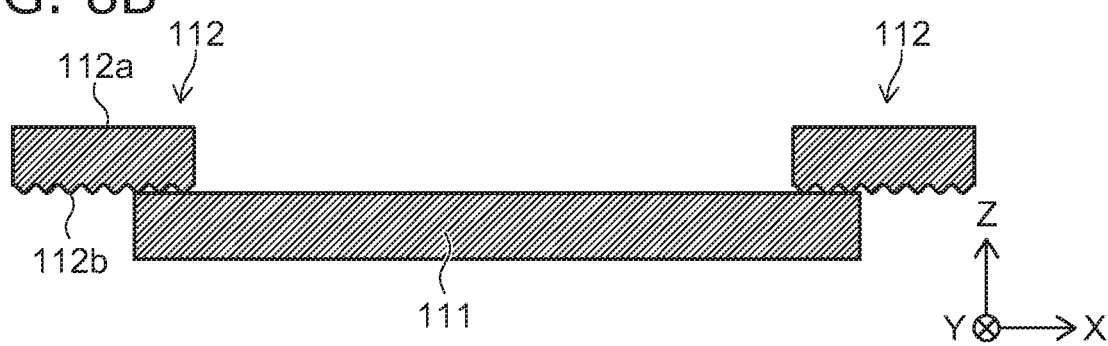

As illustrated in FIG. 8B, the surface roughness of the third surface 112a may be, for example, less than the surface roughness of the fourth surface 112b. In such a case, the surface roughness of the third surface 112a is, for example, not less than 0.1 μm and not more than 10 μm. The surface roughness of the fourth surface 112b is, for example, not less than 0.2 μm and not more than 20 μm.

Thus, by setting the surface roughness of the third surface 112a to be less than the surface roughness of the fourth surface 112b, the skin effect at the third surface 112a can be promoted, and the plasma density can be increased in the second portion 112 at which the plasma density easily becomes sparse compared to the first portion 111. Accordingly, the in-plane uniformity of the plasma density in the first electrode layer 11 can be increased.

Figure 8C:
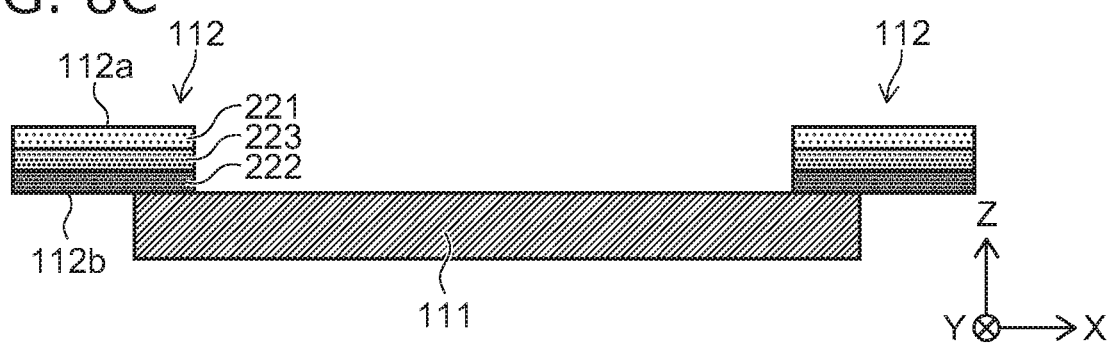
Figure 8D:
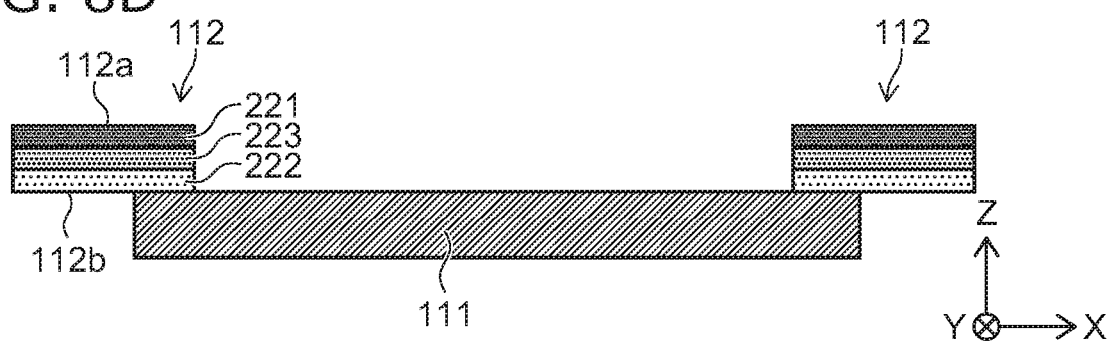

As illustrated in FIGS. 8C and 8D, the second portion 112 includes, for example, a third region 221, a fourth region 222, and an intermediate region 223. The third region 221 includes the third surface 112a. The fourth region 222 includes the fourth surface 112b. The intermediate region 223 is positioned between the third region 221 and the fourth region 222 in the Z-axis direction. The intermediate region 223 is provided as necessary and is omissible.

When the second portion 112 includes ceramic and metal, the ceramic concentration of the third region 221 is, for example, greater than the average ceramic concentration of the second portion 112 as illustrated in FIG. 8C. In other words, the metal concentration of the third region 221 is, for example, less than the average metal concentration of the second portion 112. In such a case, the ceramic concentration of the third region 221 is, for example, not less than 20% and not more than 70%. The average ceramic concentration of the second portion 112 is, for example, not less than 10% and not more than 60%.

In FIGS. 8C and 8D, the ceramic concentration and the metal concentration are illustrated by the shading of the color. More specifically, the color is darker as the ceramic concentration decreases (the metal concentration increases), and the color is lighter as the ceramic concentration increases (the metal concentration decreases). Thus, by setting the ceramic concentration of the third region 221 including the third surface 112a to be greater than the average ceramic concentration of the second portion 112, the skin effect at the third surface 112a can be suppressed, and the concentration of the current toward the center of the third surface 112a can be suppressed. Accordingly, the in-plane uniformity of the plasma density in the second portion 112 can be increased. Also, the distance between the second electrode layer 12 and the second portion 112 can be short; therefore, the impedance can be reduced, and the in-plane uniformity of the plasma density in the first electrode layer 11 can be increased. In the example illustrated in FIG. 8C, the ceramic concentration of the fourth region 222 is less than the average ceramic concentration of the second portion 112. In other words, the metal concentration of the fourth region 222 is greater than the average metal concentration of the second portion 112. The ceramic concentration of the fourth region 222 may be greater than the average ceramic concentration of the second portion 112. In other words, the metal concentration of the fourth region 222 may be less than the average metal concentration of the second portion 112.

As illustrated in FIG. 8D, the metal concentration of the third region 221 may be, for example, greater than the average metal concentration of the second portion 112. In other words, the ceramic concentration of the third region 221 may be, for example, less than the average ceramic concentration of the second portion 112. In such a case, the metal concentration of the third region 221 is, for example, not less than 30% and not more than 80%. The average metal concentration of the second portion 112 is, for example, not less than 20% and not more than 70%.

Thus, by setting the metal concentration of the third region 221 including the third surface 112a to be greater than the average metal concentration of the second portion 112, the skin effect at the third surface 112a can be promoted, and the plasma density can be increased in the second portion 112 at which the plasma density easily becomes sparse compared to the first portion 111. Accordingly, the in-plane uniformity of the plasma density in the first electrode layer 11 can be increased.

In the example illustrated in FIG. 8D, the metal concentration of the fourth region 222 is less than the average metal concentration of the second portion 112. In other words, the ceramic concentration of the fourth region 222 is greater than the average ceramic concentration of the second portion 112. The metal concentration of the fourth region 222 may be greater than the average metal concentration of the second portion 112. In other words, the ceramic concentration of the fourth region 222 may be less than the average ceramic concentration of the second portion 112.

As illustrated in FIG. 8C, the porosity is, for example, greater than the average porosity of the second portion 112. In such a case, the porosity of the third region 221 is, for example, not less than 2% and not more than 40%. The average porosity of the second portion 112 is, for example, not less than 1% and not more than 30%.

In FIGS. 8C and 8D, the porosity is illustrated by the shading of the color. More specifically, the color is darker as the porosity decreases, and the color is lighter as the porosity increases.

Thus, by setting the porosity of the third region 221 including the third surface 112a to be greater than the average porosity of the second portion 112, the skin effect at the third surface 112a can be suppressed, and the concentration of the current toward the center of the third surface 112a can be suppressed. Accordingly, the in-plane uniformity of the plasma density in the second portion 112 can be increased.

In the example illustrated in FIG. 8C, the porosity of the fourth region 222 is less than the average porosity of the second portion 112. The porosity of the fourth region 222 may be greater than the average porosity of the second portion 112.

As illustrated in FIG. 8D, the porosity of the third region 221 may be, for example, less than the average porosity of the second portion 112. In such a case, the porosity of the third region 221 is, for example, not less than 1% and not more than 30%. The average porosity of the second portion 112 is, for example, not less than 2% and not more than 40%.

Thus, by setting the porosity of the third region 221 including the third surface 112a to be less than the average porosity of the second portion 112, the skin effect at the third surface 112a can be promoted, and the plasma density can be increased in the second portion 112 at which the plasma density easily becomes sparse compared to the first portion 111. Accordingly, the in-plane uniformity of the plasma density in the first electrode layer 11 can be increased.

In the example illustrated in FIG. 8D, the porosity of the fourth region 222 is less than the average porosity of the second portion 112. The porosity of the fourth region 222 may be greater than the average porosity of the second portion 112.

Figure 9A:
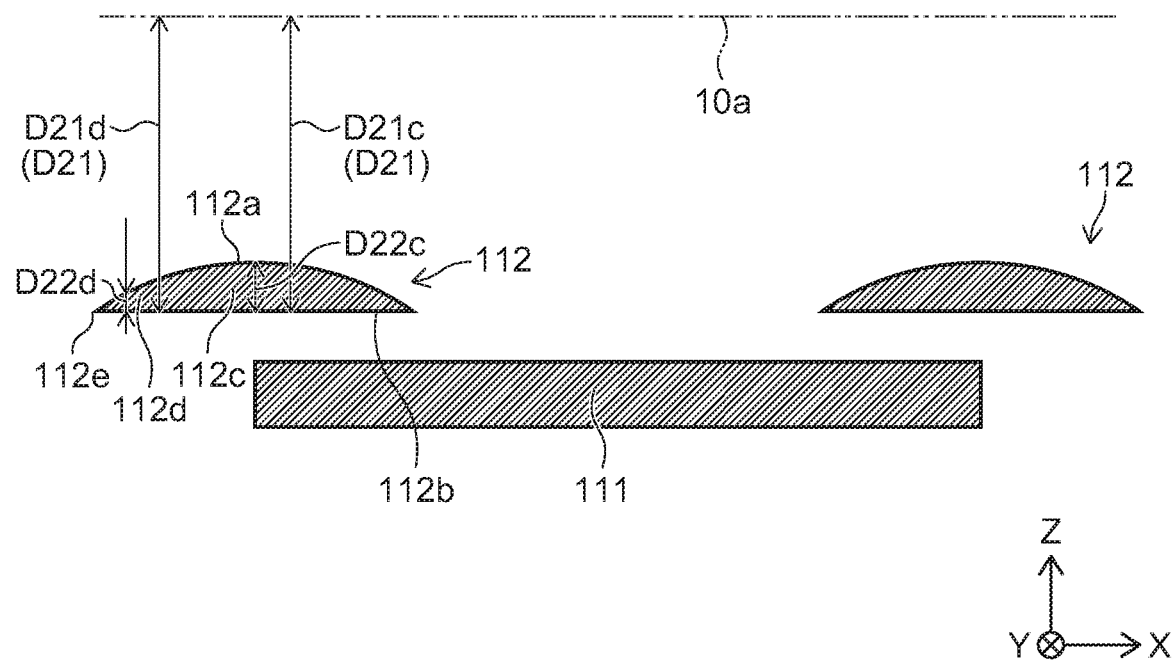
FIGS. 9A and 9B are cross-sectional views schematically illustrating examples of the first electrode layer of the electrostatic chuck according to the embodiment.
Figure 9B:
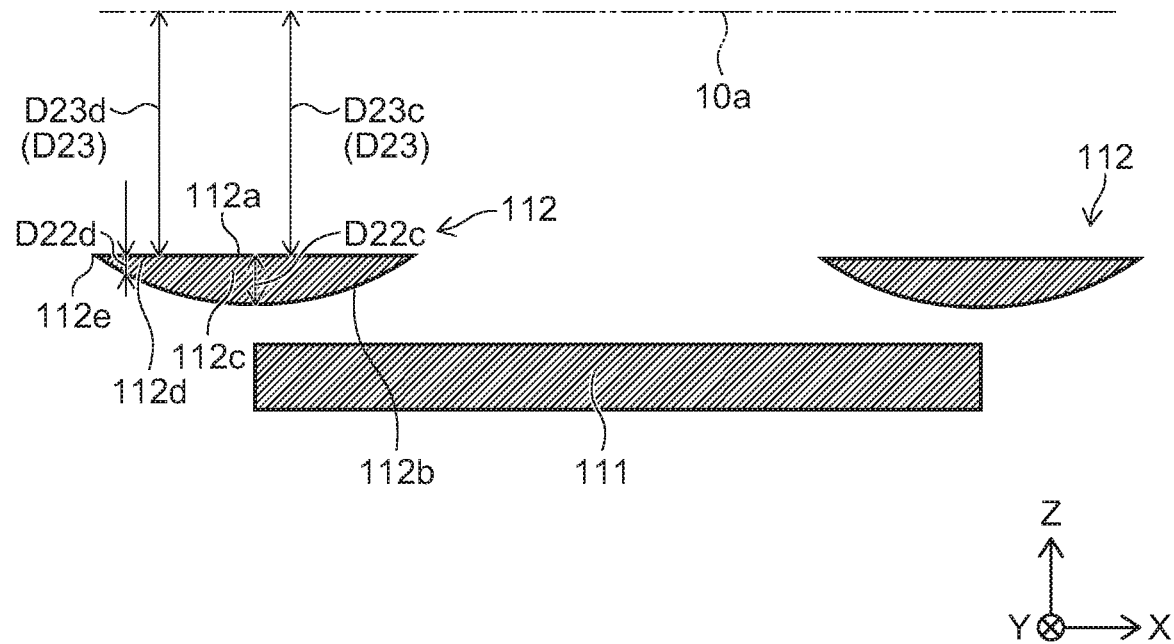

FIGS. 9A and 9B are cross-sectional views schematically illustrating examples of the first electrode layer of the electrostatic chuck according to the embodiment.

As illustrated in FIGS. 9A and 9B, the second portion 112 includes, for example, a central portion 112c and an end portion 112d (a circumferential end portion). The end portion 112d of the second portion 112 is a region including an edge 112e of the second portion 112 in the X-Y plane. The edge 112e of the second portion 112 is positioned in the third surface 112a or the fourth surface 112b and refers to the interface between the second portion 112 and the ceramic dielectric substrate 10 when viewed from the Z-axis direction. The central portion 112c of the second portion 112 is the region positioned between the two end portions 112d in the X-Y plane.

In the example illustrated in FIG. 9A, a distance D21 along the Z-axis direction between the fourth surface 112b and the first major surface 10a is constant. More specifically, a distance D21c along the Z-axis direction between the fourth surface 112b and the first major surface 10a at the central portion 112c of the second portion 112 is equal to a distance D21d along the Z-axis direction between the fourth surface 112b and the first major surface 10a at the end portion 112d of the second portion 112. That is, in the example, the fourth surface 112b is parallel to the first major surface 10a.

Here, "constant" can include, for example, the waviness of the fourth surface 112b, etc. For example, it is sufficient for the distance to be substantially constant when the cross section of the electrostatic chuck 100 is observed with a scanning electron microscope (SEM) or the like at a low magnification (e.g., about 100 times). The difference between the distance D21c and the distance D21d is, for example, 0±150 μm.

On the other hand, in the example as illustrated in FIG. 9A, the third surface 112a is not parallel to the first major surface 10a. In the example, the cross-sectional shape of the second portion 112 is upwardly convex. More specifically, a distance D22d along the Z-axis direction between the third surface 112a and the fourth surface 112b at the end portion 112d of the second portion 112 is, for example, less than a distance D22c along the Z-axis direction between the third surface 112a and the fourth surface 112b at the central portion 112c of the second portion 112. In other words, the distance D22c is the thickness of the second portion 112 at the central portion 112c. In other words, the distance D22d is the thickness of the second portion 112 at the end portion 112d. That is, the thickness of the second portion 112 at the end portion 112d is less than the thickness of the second portion 112 at the central portion 112c. For example, the thickness of the second portion 112 decreases from the central portion 112c toward the end portion 112d. The shape of the second portion 112 is convex at the third surface 112a side.

For example, the distance D22c and the distance D22d can be determined from a cross section SEM (Scanning Electron Microscope) image of the second portion 112. For example, the distance D22c can be determined as the average value of thicknesses at three points in the central portion 112c. In this specification, the distance D22c is defined as this average value.

Thus, the concentration of the electric field toward the end portion 112d of the second portion 112 can be suppressed by setting the distance D21 along the Z-axis direction between the fourth surface 112b and the first major surface 10a to be constant and by setting the distance D22d along the Z-axis direction between the third surface 112a and the fourth surface 112b at the end portion 112d of the second portion 112 to be less than the distance D22c along the Z-axis direction between the third surface 112a and the fourth surface 112b at the central portion 112c of the second portion 112. The dielectric breakdown at the end portion 112d of the second portion 112 can be suppressed thereby.

The cross-sectional shape of the second portion 112 is not limited to the cross-sectional shape illustrated in FIG. 9A. The third surface 112a may be parallel to the fourth surface 112b at the central portion 112c, and may include a tilted surface that is tilted downward toward the edge 112e at the end portion 112d. In other words, the thickness of the second portion 112 may be constant at the central portion 112c. The tilted surface may be planar or curved.

In the example illustrated in FIG. 9B, a distance D23 along the Z-axis direction between the third surface 112a and the first major surface 10a is constant. More specifically, a distance D23c along the Z-axis direction between the third surface 112a and the first major surface 10a at the central portion 112c of the second portion 112 is equal to a distance D23d along the Z-axis direction between the third surface 112a and the first major surface 10a at the end portion 112d of the second portion 112. That is, in the example, the third surface 112a is parallel to the first major surface 10a.

Here, "constant" can include, for example, the waviness of the third surface 112a, etc. For example, it is sufficient for the distance to be substantially constant when the cross section of the electrostatic chuck 100 is observed with a scanning electron microscope (SEM) or the like at a low magnification (e.g., about 100 times). The difference between the distance D23c and the distance D23d is, for example, 0±150 μm.

On the other hand, in the example as illustrated in FIG. 9B, the fourth surface 112b is not parallel to the first major surface 10a. In the example, the cross-sectional shape of the second portion 112 is downwardly convex. More specifically, the distance D22d along the Z-axis direction between the third surface 112a and the fourth surface 112b at the end portion 112d of the second portion 112 (i.e., the thickness of the second portion 112 at the end portion 112d) is less than the distance D22c along the Z-axis direction between the third surface 112a and the fourth surface 112b at the central portion 112c of the second portion 112 (i.e., the thickness of the second portion 112 at the central portion 112c). For example, the thickness of the second portion 112 decreases from the central portion 112c toward the end portion 112d. The shape of the second portion 112 is convex at the fourth surface 112b side.

Thus, the distance D23 along the Z-axis direction between the third surface 112a and the first major surface 10a is set to be constant, and the distance D22d along the Z-axis direction between the third surface 112a and the fourth surface 112b at the end portion 112d of the second portion 112 is set to be less than the distance D22c along the Z-axis direction between the third surface 112a and the fourth surface 112b at the central portion 112c of the second portion 112; thereby, the electric field strength and the plasma density can be increased in the second portion 112 at which the plasma density easily becomes sparse compared to the first portion 111. The in-plane uniformity of the plasma density in the first electrode layer 11 can be increased thereby.

The cross-sectional shape of the second portion 112 is not limited to the cross-sectional shape illustrated in FIG. 9B. The fourth surface 112b may be parallel to the third surface 112a at the central portion 112c and may include a tilted surface that is tilted upward toward the edge 112e at the end portion 112d. In other words, the thickness of the second portion 112 at the central portion 112c may be constant. The tilted surface may be planar or curved.

A method for making the ceramic dielectric substrate 10 inside which the first electrode layer 11 and the second electrode layer 12 are provided will now be described.

For example, the ceramic dielectric substrate 10 in which the first electrode layer 11 and the second electrode layer 12 are embedded may be made by sintering as a continuous body in a state in which the first electrode layer 11 and the second electrode layer 12 are inside the ceramic dielectric substrate 10.

For example, the first electrode layer 11 (the first portion 111 and the second portion 112) is formed by screen printing, paste coating (spin coating, a coater, inkjet, a dispenser, etc.), vapor deposition, etc. For example, the first electrode layer 11 can be formed by separately performing multiple stacking of the layers in a state in which the first major surface 10a is down. At this time, for example, the electrical resistance of the first surface 111a of the first portion 111 can be set to be greater than the average electrical resistance of the first portion 111 by adjusting the electrical resistance of the first surface 111a of the first portion 111, the average electrical resistance of the first portion 111, etc., by adjusting the stacking conditions, etc. Also, the surface roughness, the ceramic concentration (the metal concentration), the porosity, etc., can be adjusted for the first portion 111 and/or the second portion 112.

FIG. 10 is a cross-sectional view schematically illustrating a wafer processing apparatus including the electrostatic chuck according to the embodiment.

As illustrated in FIG. 10, the wafer processing apparatus 500 includes the processing container 501, the high frequency power supply 504, the clamping power supply 505, the upper electrode 510, and the electrostatic chuck 100. The upper electrode 510 and a processing gas inlet 502 for introducing a processing gas to the interior are provided at the ceiling of the processing container 501. An exhaust port 503 for evacuating the interior is provided at the bottom plate of the processing container 501. The electrostatic chuck 100 is disposed under the upper electrode 510 inside the processing container 501. The upper electrode 510 and the first electrode layer 11 of the electrostatic chuck 100 are connected to the high frequency power supply 504. The second electrode layer 12 of the electrostatic chuck 100 is connected to the clamping power supply 505.

The upper electrode 510 and the first portion 111 of the first electrode layer 11 are provided to be substantially parallel and separated from each other by a prescribed spacing. More specifically, the first surface 111a of the first portion 111 is substantially parallel to a lower surface 510a of the upper electrode 510. Also, the first major surface 10a of the ceramic dielectric substrate 10 is substantially parallel to the lower surface 510a of the upper electrode 510. The clamping object W is placed on the first major surface 10a positioned between the first electrode layer 11 and the upper electrode 510.

When a voltage (a high frequency voltage) is applied to the electrode layer 110 and the upper electrode 510 from the high frequency power supply 504, high frequency electric discharge occurs; the processing gas that is introduced to the processing container 501 is excited by the plasma and activated; and the clamping object W is processed.

When a voltage (a clamping voltage) is applied to the electrode layer 110 from the clamping power supply 505, a charge is generated at the first major surface 10a side of the electrode layer 110; and the clamping object W is held to the electrostatic chuck 100A by an electrostatic force.

According to the embodiments as described above, an electrostatic chuck can be provided in which the in-plane uniformity of the plasma density can be increased.

Hereinabove, embodiments of the invention are described. However, the invention is not limited to these descriptions. Appropriate design modifications made by one skilled in the art for the embodiments described above also are within the scope of the invention to the extent that the features of the invention are included. For example, the configurations, the dimensions, the materials, the arrangements, the mounting methods, etc., of the components included in the electrostatic chuck are not limited to those illustrated and can be modified appropriately.

Also, the components included in the embodiments described above can be combined within the limits of technical feasibility; and such combinations are within the scope of the invention to the extent that the features of the invention are included.

What is claimed is:

1. An electrostatic chuck, comprising:
a ceramic dielectric substrate including a first major surface and a second major surface, the first major surface being configured to have an object placed thereon and clamped by the electrostatic chuck, the second major surface being at a side opposite to the first major surface;
a base plate supporting the ceramic dielectric substrate;
at least one first electrode layer provided inside the ceramic dielectric substrate and connected to a high frequency power supply from a side of the second major surface; and
at least one second electrode layer provided inside the ceramic dielectric substrate and connected to a clamping power supply,
the first electrode layer being provided between the first major surface and the second major surface in a Z-axis direction extending from the base plate toward the ceramic dielectric substrate,
the second electrode layer being provided between the first electrode layer and the first major surface in the Z-axis direction,
the first electrode layer including a first portion and second portion, the first portion being positioned more centrally of the ceramic dielectric substrate than is the second portion when projected onto a plane perpendicular to the Z-axis direction,
the first portion including a first surface at a side of the first major surface, and a second surface at a side opposite to the first surface,
the second portion including a third surface at the side of the first major surface, and a fourth surface at a side opposite to the third surface,
the third surface being positioned between the first surface and the second electrode layer in the Z-axis direction, and
an electrical resistance of the first surface being greater than an average electrical resistance of the first portion.

2. The chuck according to claim 1, wherein
a surface roughness of the first surface is greater than a surface roughness of the second surface.

3. The chuck according to claim 1, wherein
the first portion includes ceramic and metal,
the first portion includes a first region including the first surface, and a second region including the second surface, and
a ceramic concentration of the first region is greater than an average ceramic concentration of the first portion.

4. The chuck according to claim 3, wherein
a ceramic concentration of the second region is greater than the average ceramic concentration of the first portion.

5. The chuck according to claim 1, wherein
the first portion includes a first region including the first surface, and a second region including the second surface, and
a porosity of the first region is greater than an average porosity of the first portion.

6. The chuck according to claim 5, wherein
a porosity of the second region is greater than the average porosity of the first portion.

7. The chuck according to claim 1, wherein
a surface roughness of the third surface is greater than a surface roughness of the fourth surface.

8. The chuck according to claim 1, wherein
a surface roughness of the third surface is less than a surface roughness of the fourth surface.

9. The chuck according to claim 1, wherein
the second portion includes ceramic and metal,
the second portion includes a third region including the third surface, and a fourth region including the fourth surface, and a ceramic concentration of the third region is greater than an average ceramic concentration of the second portion.

10. The chuck according to claim 1, wherein
the second portion includes ceramic and metal,
the second portion includes a third region including the third surface, and a fourth region including the fourth surface, and
a metal concentration of the third region is greater than an average metal concentration of the second portion.

11. The chuck according to claim 1, wherein
the second portion includes a third region including the third surface, and a fourth region including the fourth surface, and
a porosity of the third region is greater than an average porosity of the second portion.

12. The chuck according to claim 1, wherein
the second portion includes a third region including the third surface, and a fourth region including the fourth surface, and
a porosity of the third region is less than an average porosity of the second portion.

13. The chuck according to claim 1, wherein
a distance along the Z-axis direction between the fourth surface and the first major surface is constant, and
a thickness of the second portion in the Z-axis direction between the third surface and the fourth surface varies such that the thickness at a circumferential end portion of the second portion which is less than the thickness at a central portion of the second portion.

14. The chuck according to claim 1, wherein
a distance along the Z-axis direction between the third surface and the first major surface is constant, and
a thickness of the second portion in the Z-axis direction between the third surface and the fourth surface varies such that the thickness at a circumferential end portion of the second portion which is less than the thickness at a central portion of the second portion.

15. The chuck according to claim 1, wherein
a surface roughness of the third surface is different from a surface roughness of the fourth surface.

* * * * *